United States Patent
Chen et al.

(10) Patent No.: US 6,215,180 B1
(45) Date of Patent: Apr. 10, 2001

(54) DUAL-SIDED HEAT DISSIPATING STRUCTURE FOR INTEGRATED CIRCUIT PACKAGE

(75) Inventors: Tsung-Chieh Chen, Taipei; Ken-Hsiung Hsu, Hsinchu; Yi-Liang Peng, Hsinchu; Cheng-Chieh Hsu, Hsinchu, all of (TW)

(73) Assignee: First International Computer Inc., Taipei (TW)

( * ) Notice: Subject to any disclaimer, the term of this patent is extended or adjusted under 35 U.S.C. 154(b) by 0 days.

(21) Appl. No.: 09/270,808

(22) Filed: Mar. 17, 1999

(51) Int. Cl.[7] .................... H01L 23/34; H01L 23/495
(52) U.S. Cl. ..................... 257/720; 257/675; 438/122
(58) Field of Search ........................ 257/675, 706, 257/707, 712, 713, 717, 720, 722; 438/122

(56) References Cited

U.S. PATENT DOCUMENTS

| | | | |
|---|---|---|---|
| 4,509,096 | * 4/1985 | Baldwin et al. | 361/386 |
| 5,227,663 | * 7/1993 | Patil et al. | 257/719 |
| 5,365,107 | * 11/1994 | Kuraishi et al. | 257/712 |
| 5,486,720 | * 1/1996 | Kierse | 257/707 |
| 5,541,450 | * 7/1996 | Jones et al. | 257/697 |
| 6,000,125 | * 12/1999 | Kang | 257/719 |

FOREIGN PATENT DOCUMENTS

| | | | |
|---|---|---|---|
| 63-240053 | * 5/1988 | (JP) | 257/707 |
| 4-11758 | * 1/1992 | (JP) | 257/707 |

* cited by examiner

Primary Examiner—Olik Chaudhuri
Assistant Examiner—Marcos D. Pizarro-Crespo
(74) Attorney, Agent, or Firm—Dougherty & Troxell

(57) ABSTRACT

A dual-sided heat dissipating structure for BGA package includes a step-shaped first heat dissipating member adhering to an active side of the chip and a dish-shaped perforated second heat dissipating member adhering to a non-active side of the chip so that heat generated in the chip may be dissipated more effectively. The step surface first heat dissipating member may also serve as a press mold to enable bonding of inner leads of the substrate to the bonding pads of the chip can be done along with adhering of the first heat dissipating member to the chip at same process in the mean time without additional process or equipment. The perforated second heat dissipating member enables moisture escaping from the package to avoid pop corn effect resulting from IR Reflow test. The package may be made at a thin thickness and low cost.

6 Claims, 6 Drawing Sheets

DUAL-SIDED HEAT DISSIPATING STRUCTURE FOR INTEGRATED CIRCUIT PACKAGE

BACKGROUND OF THE INVENTION

1. Field of the Invention

This invention relates to a dual-sided heat dissipating structure and its fabrication method for integrated circuit package and particularly to Ball Grid Array package (BGA package) that has two lateral sides engageable respectively with a heat dissipating member for enhancing heat dissipating effect.

2. Description of the Prior Art

In semiconductor integrated circuit (IC) industry nowadays, how to make IC packages small size with good heat dissipating property at low cost is a goal almost universally pursued. Heat dissipating property of IC package directly affects IC performance and reliability. It is a subject attracted heavy research and development.

One of the techniques being used to address this issue is generally called "Enhanced BGA" (EBGA). FIG. 1 illustrates an example using EBGA. The EBGA package 10 includes an IC chip 11, a Tape Automated Bond Tape (TAB Tape) 12 which has a metallic circuitry 121 formed thereon, a plurality of solder balls 13 and a metallic heat dissipating member 16. The solder balls 13 are attached to a bottom side of the TAB Tape 12 and are nested in a layer of non-conductive solder ball mask 14 for preventing short circuit of the circuitry 121 resulting from oversize solder balls 13. The TAB Tape 12 has a center opening to accommodate the IC chip 11. The IC chip 11 couples with the circuitry 121 by means of gold wires 17. As the TAB Tape 12 is thinner than conventional wiring frame and is more desirable for multilayer circuit design, high performance and complex and multilayer metallic circuitry 121 may be produced. The whole EBGA package 10 may be made thin and small size. Furthermore the IC chip 11 and the TAB Tape 12 are adhered to the heat dissipating member 16 by means of EPOXY 18 which has good heat dissipating property. The heat dissipating member 16 also provides support for the IC chip 11 and the generally soft TAB Tape 12.

However the structure set forth above has a non-active side of the IC chip 11 adhering to the heat dissipating member 16. The active side i.e., the side where semiconductor circuitry located of the IC chip 11 is covered by a layer of underfilling 15 through molding process. The under filling 15 is usually a poor heat conducting resin. Most heat generated in the IC chip is taking place on the active side. The heat dissipating member 16 attached to the non-active side of the IC chip 11 thus has only limited effect on heat dissipation of the IC chip.

FIG. 2 illustrates another conventional Tape BGA package structure. The TBGA package 20, like the EBGA package shown in FIG. 1, also has an IC chip 21, a TAB Tape 22, a plurality of solder balls 23, a heat dissipating member 26 and a bottom underfilling 25. However in the TBGA package 20 the metallic circuitry forms a plurality of inner leads 222 extending to a center opening of the TAB Tape 22. The inner leads 222 are taping to bonding pads 211 located on the IC chip 21 by means of Tape Automated Bonding (TAB) process. Wire bonding process used in the EBGA package is thus omitted. Production time and cost are lower. But there is no much improvement in heat dissipating effect since the heat dissipating member 26 is still attached on the non-active side of the chip 21.

FIG. 3 illustrates yet another example of EBGA package 30 which uses a printer-circuit-board-like substrate 32 to support an IC chip 31. There are inner solder balls 37 to couple the active side of IC chip 31 with the metallic circuitry 321 laid on the substrate 32. An underfilling 35 is poured between the IC chip and the substrate and surrounds the inner solder balls 37 to protect the circuitry for enhancing the package reliability. A dish-shaped heat dissipating member 36 adheres to a non-active side of the IC chip 31 and the substrate 32 by means of EPOXY adhesive 38 (or a heat conductive resin) which has relative good heat conductivity. Like the previous examples, this structure also is not able to improve heat dissipating function very much. Moreover there is a closed void space 39 formed between the heat dissipating member 36 and the IC chip 31 and the substrate 32. The close void space 39 tends to trap moisture either from atmosphere or EPOXY adhesive 38. In the manufacturing process, when the EBGA package 30 is soldered to a printed circuit board or under IR Reflow test, it will be heated to 230° C. in a short time. The moisture trapped in the void space 39 will be vaporized and expanded and results in the heat dissipating member 36 breaking away from the substrate 32 (commonly called "Pop Corn Effect"). In order to prevent the Pop Corn Effect from happening, an additional procedure of vacuuming or filling nitrogen gas in the void space 39 is necessary. This additional procedure will increase production complexity and cost and still cannot totally eliminate the Pop Corn Effect.

Then there is a further EBGA package scheme being introduced as shown in FIG. 4. The EBGA package 40 has a heat dissipating member 46 adhering to an active side (i.e., where gold lines 47 are bonded) of the IC chip 41. While the IC chip 41 generating heat may be dissipated quickly through the heat dissipating member 46, the non-active side of the chip 41 adheres to the substrate 42 has relatively poor heat dissipating effect. Moreover to protect the gold wire 47 from unduly contact with the surroundings, the heat dissipating member 46 should be made in a T-shape and should have a greater thickness. This will make the whole package bulky.

All of this shows that there is still a lot of room for improvement regard producing low cost IC package at small size with high heat dissipating efficiency.

SUMMARY OF THE INVENTION

In view of aforesaid disadvantages, it is therefore an object of this invention to provide a dual-sided heat dissipating IC package which has two heat dissipating members adhering respectively to the active and non-active sides of the IC chip for enhancing heat dissipating effect such that the IC package may be made at a thin thickness.

It is another object of this invention to provide a dual-sided heat dissipating IC package that includes a step-surfaced heat dissipating member which may serve as a press mold for bonding the IC chip to the substrate. Hence adhering the heat dissipating member to the IC chip and the substrate may be done along with the bonding of IC chip to the substrate at the same process without additional equipment or procedure.

It is a further object of this invention to provide a dual-sided heat dissipating IC package that has a perforated dish-shaped heat dissipating member adhering to a non-active side of the IC chip so that moisture trapped in the void space formed between the heat dissipating member and the IC chip may escape without producing Pop Corn Effect.

The dual-sided heat dissipating IC package according to this invention includes a semiconductor chip which has at least one active side laid with semiconductor circuits, a substrate which has a center opening for holding the chip and a metallic circuitry that forms a plurality of inner leads extending to the center opening and coupling with the semiconductor circuits, a plurality of metallic solder balls mounted on the substrate and coupled with the metallic circuitry, a first heat dissipating member adhering to the active side of the chip and the substrate by means of a non-conductive adhesive, and a second heat dissipating member adhering to a side of the chip remote from the substrate by means of a non-conductive adhesive so that two sides of the chip may dissipate heat.

The first heat dissipating member further has a step surface which includes a thickest center portion adhering to the chip, an intermediate portion adhering to the inner leads and a thin outskirt portion adhering to the substrate. The step-surfaced first heat dissipating member may also serve as a press mold for bonding the inner leads to bonding pads of the chip while the first heat dissipating member being adhered to the chip and substrate at the same process in the mean time.

The second heat dissipating member is formed in a dish shaped with a concave center portion to hold the chip and a flange to adhere to the substrate at a side remote to the solder balls. The second heat dissipating member adheres to a non-active side of the chip by means of a non-conductive adhesive. The second heat dissipating member further is perforated to facilitate air ventilation between the space formed between the second heat dissipating member and the chip and ambience for preventing pop corn effect from happening.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

This invention mainly aims to enhance heat dissipating effect of a BGA package by placing two heat dissipating members respectively at two sides of an IC chip (on an active side and a non-active side). The heat dissipating member at the active side has a step surface which may serve as a press mold for bonding inner leads of the substrate to bonding pads of the IC chip. Therefore adhering of the heat dissipating member to the IC chip and substrate may be done at the same bonding process without additional procedure or equipment. Total cost is lower. Moreover the heat dissipating members are substantially parallel to the substrate at same thickness level and do not increase total thickness of the BGA package. The whole BGA package may be made small size. The following offers more detailed embodiment of this invention.

Figure 1:
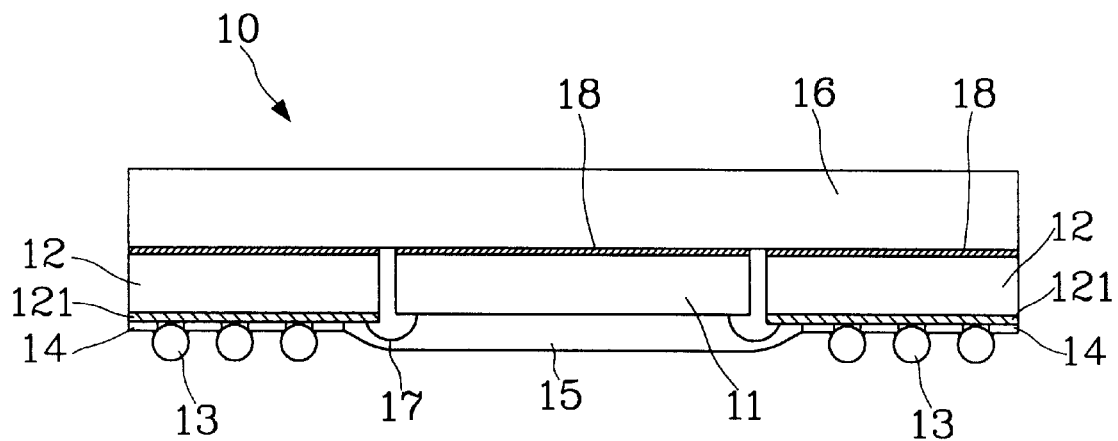
FIG. 1 is a schematic view of an embodiment of a conventional Enhanced BGA package 10.
Figure 2:
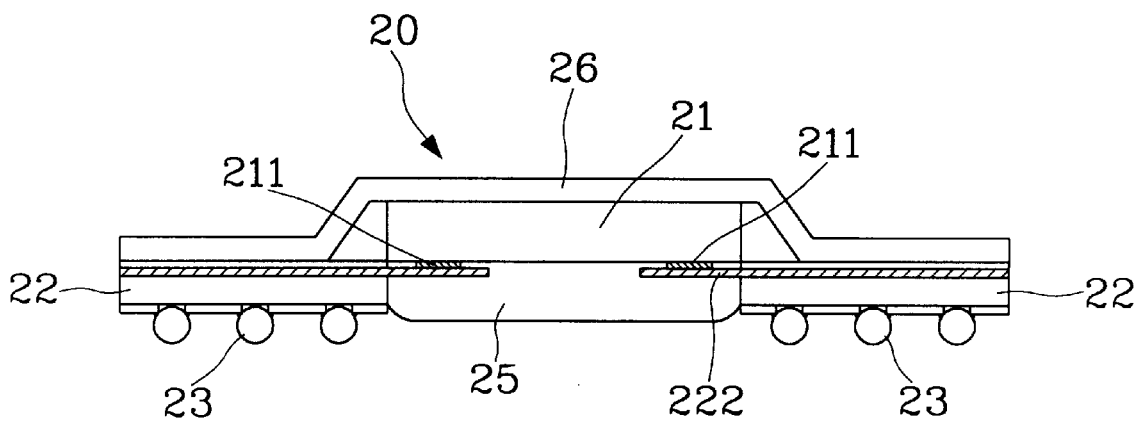
FIG. 2 is a schematic view of an embodiment of a conventional TBGA package 20.
Figure 3:
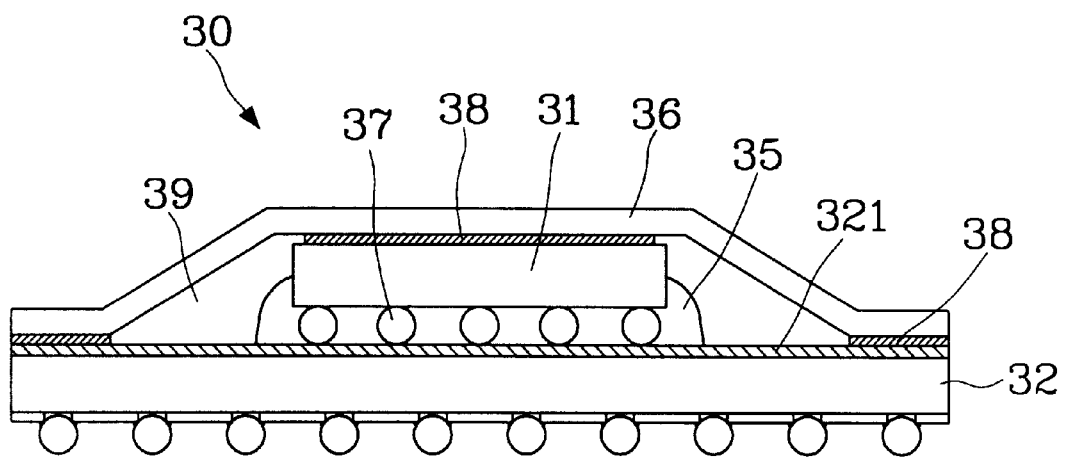
FIG. 3 is a schematic view of another embodiment of a conventional Enhanced BGA package 30.
Figure 4:
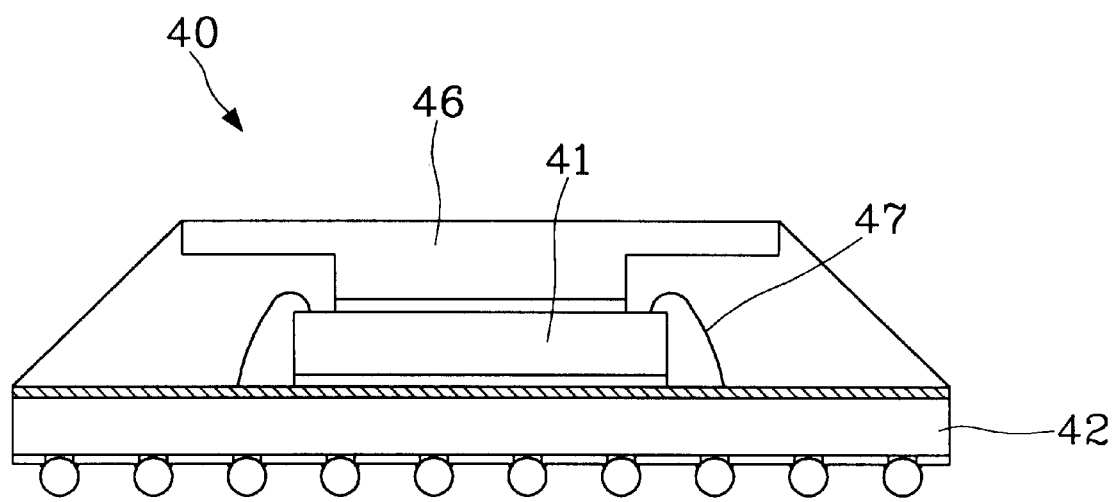
FIG. 4 is a schematic view of further embodiment of a conventional Enhanced BGA package 40.
Figure 5:
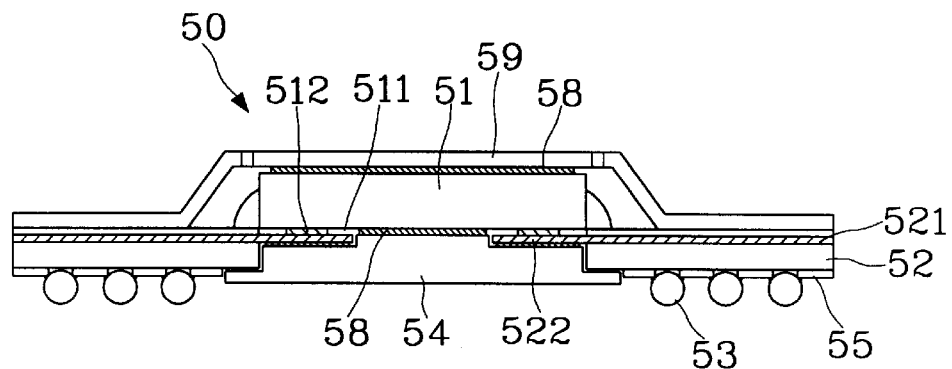
FIG. 5 is a schematic view of an preferred embodiment this invention.
Figure 6:
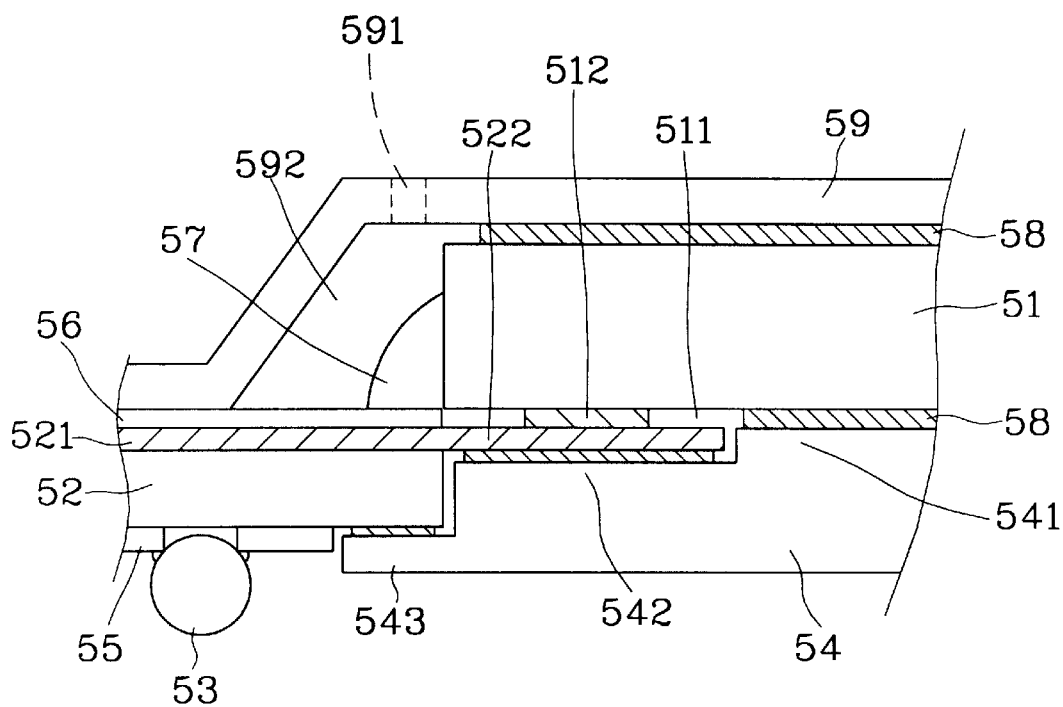
FIG. 6 is an enlarged fragmentary view of this invention shown in FIG. 5.

Referring to FIGS. 5 and 6, the dual-sided heat dissipating IC package 50 according to this invention includes a semiconductor chip 51 which has at least one active side 511 laid with semiconductor circuitries upon which a plurality of bonding pads 512 are mounted, a substrate 52 which may be a conventional Tape Automated Bonding Tape (TAB Tape) or a printed circuit board, a plurality of metallic solder balls 53 attached to the bottom side of the substrate 52, a first heat dissipating member 54 and a second heat dissipating member 59.

The substrate 52 has at least one side laid with a metallic circuit 521 formed by depositing, sputtering, electroplating, adhering or other desirable means at least one conductive layer made of gold, copper, iron, nickel or their alloys, then form by the processes of etching, ion cutting, laser cutting and the like. The metallic circuit 521 has a plurality of inner leads 522 extending to a center opening formed in the substrate 52 and being bonded with the bonding pads 512 for coupling with the semiconductor circuitries. Upon the metallic circuit 521, there may be provided with a layer of protective insulating material 56 such as resin or epoxy, through spreading, adhering, depositing or other desirable process.

The metallic solder balls 53 may be made of conductive materials such as tin, gold, silver and the like. They are generally mounted on the substrate 52 by means of heat soldering and coupled with the metallic circuit 521 through conductive plugs (not shown in the figures). A non-conductive solder ball mask 55 may also be formed on the surface of the substrate 52 and surrounds the solder balls 53 for preventing short circuit of the metallic circuit 521 resulting from oversize solder balls 53.

The first and second heat dissipating member 54 and 59 may be made of a good heat conducting material such as aluminum, copper, iron, nickel or their alloys and the like formed in a thin plate, and adhere respectively to the active side 511 and non-active side opposite to the active side 511 by means of a non-conductive adhesive 58. The adhesive 58 for the active side 511 is preferably a good heat conductive type polymer while for non-active side may be epoxy resin or a dual-sided adhesive tape. The adhering of the first and second heat dissipating member 54 and 59 to the substrate 52 may use adhesive epoxy known in the art.

In a preferred embodiment of this invention, the first heat dissipating member 54 is formed with a step-shaped top surface and a flat bottom surface. The step-shaped top surface has a thickest center portion 541 adhering to the chip 51 on the active side 511, an intermediate portion 542 adhering to the inner leads 522 and a thin outskirt portion 543 adhering to the substrate 52. The thickness of the first dissipating member 54 is about the same of the substrate 52. The center portion 541 and the intermediate portion 542 are located in the center opening of the substrate 52 and may serve as a press mold for bonding the inner leads 522 to the chip 51 at the bonding pads 512. Therefore adhering of the first heating members 54 to the chip 51 and the substrate 52 may be done at the same process of die bonding mentioned above in the mean time without additional process or equipment. Process time and cost thus may be saved. And total package thickness does not increase too. The step-shaped top surface of the first heat dissipating member 54 further may provide position and support function for the chip 51 and the substrate 52. The bottom surface of the first heat dissipating member 54 may also be made a corrugated form to increase heat dissipating area.

The second heat dissipating member 59 is formed in a dish shape with a concave center portion to hold the chip 51 and a flange to adhere to the substrate 52 at a side remote to the solder balls. The top wall of the second heat dissipating member 59 further has through apertures 591 formed therein. The second heat dissipating member 59 substantially covers the chip 51 and the substrate 52 and thus forms an close void space 592 therebetween. An underfilling 57 may be poured and surround the perimeter of the chip 51 and the top surface of the substrate 52 for holding the chip 51 securely. The apertures 591 may enable moisture trapped in the void space 592 escaping out of the package to avoid possible pop corn effect.

Figure 7:
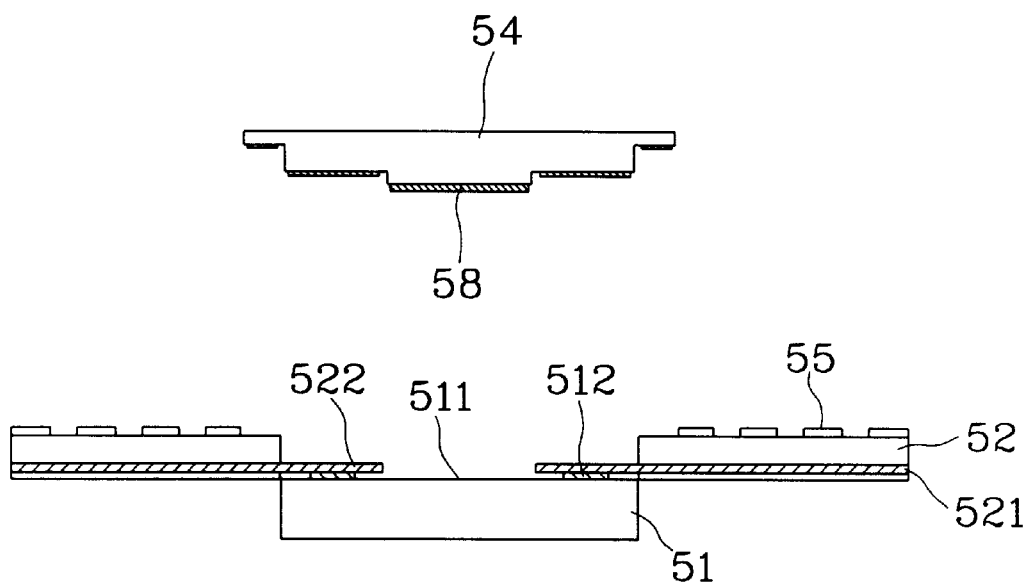
FIGS. 7A to 7D are schematic views of fabrication steps of this invention.
Figure 7:
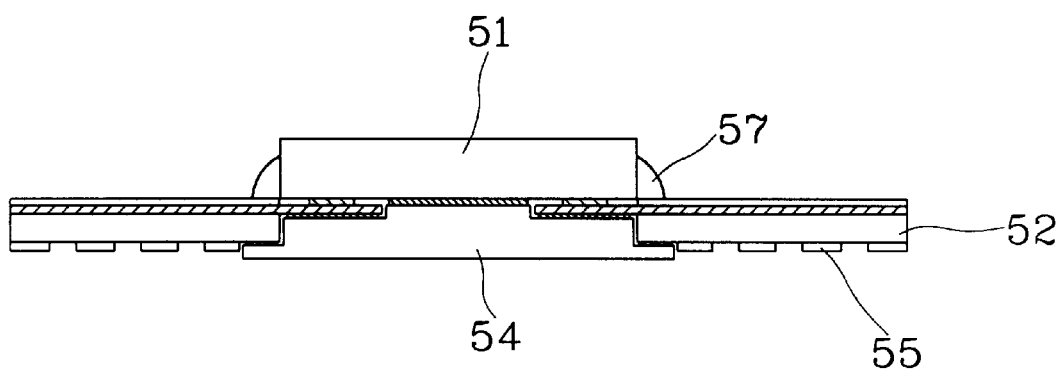
Figure 7:
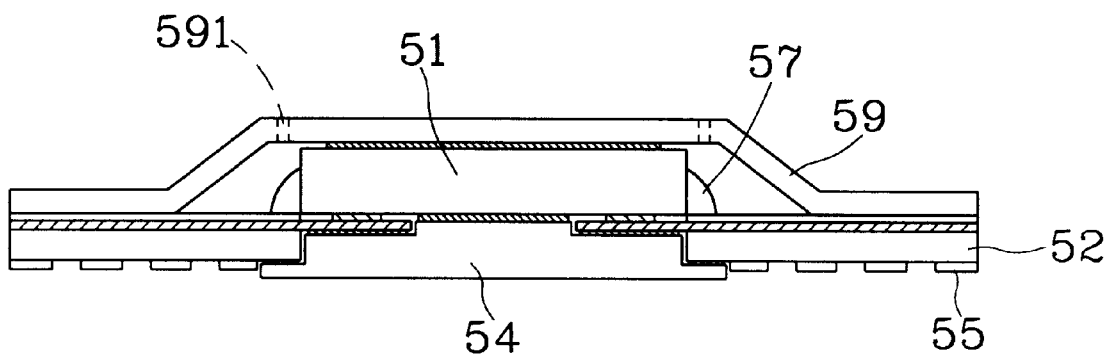
Figure 7:
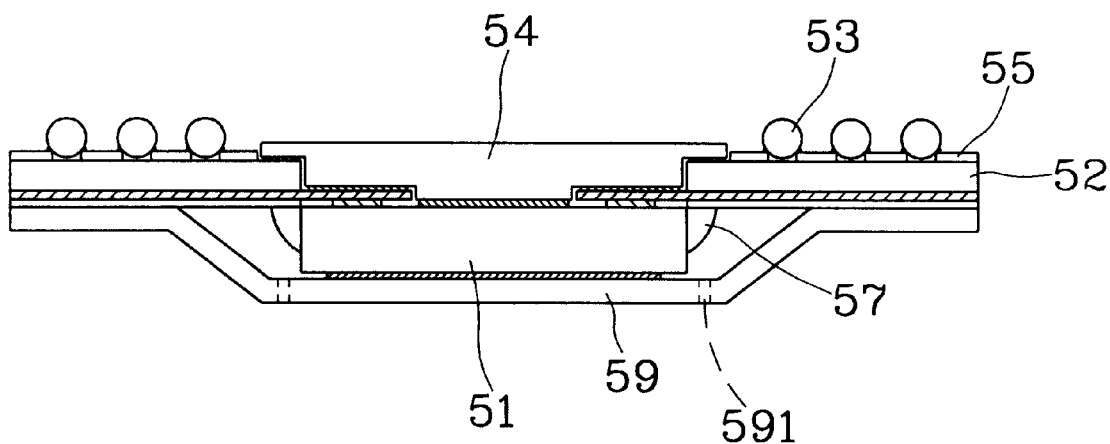

Besides the novel structure set forth above, this invention also offers a method for producing the package of this invention as shown in FIGS. 7A–7D, with the steps as follows:

a. Preparing elements needed, including a chip 51, a substrate 52 with a metallic circuit 521 and inner leads 522, a first heat dissipating member 54, a second heat dissipating member 59 and a plurality of metallic solder balls 53;

b. Bonding the inner leads 522 against the bonding pads 512 of the chip 51 and bonding the first heat dissipating member 54 against the chip 51 and the substrate 52 with a non-conductive adhesive 58 and with the center portion against the active side 511 of the chip, the intermediate portion against the inner leads 522 and the outskirt portion against the substrate 52 (FIG. 7A).

c. Underfilling the chip 51 perimeter and the substrate 52 with an underfilling 57 (FIG. 7B);

d. Attaching the second heat dissipating member 59 over the chip 51 on the non-active side opposite to the first heat dissipating member 54, and adhering to the chip and the substrate by means of a non-conductive adhesive (FIG. 7C); and e. Ball attaching the metallic solders balls 53 on the surface of the substrate 52 facing the first heat dissipating member 54 to couple with the metallic circuit 521.

Figure 8:
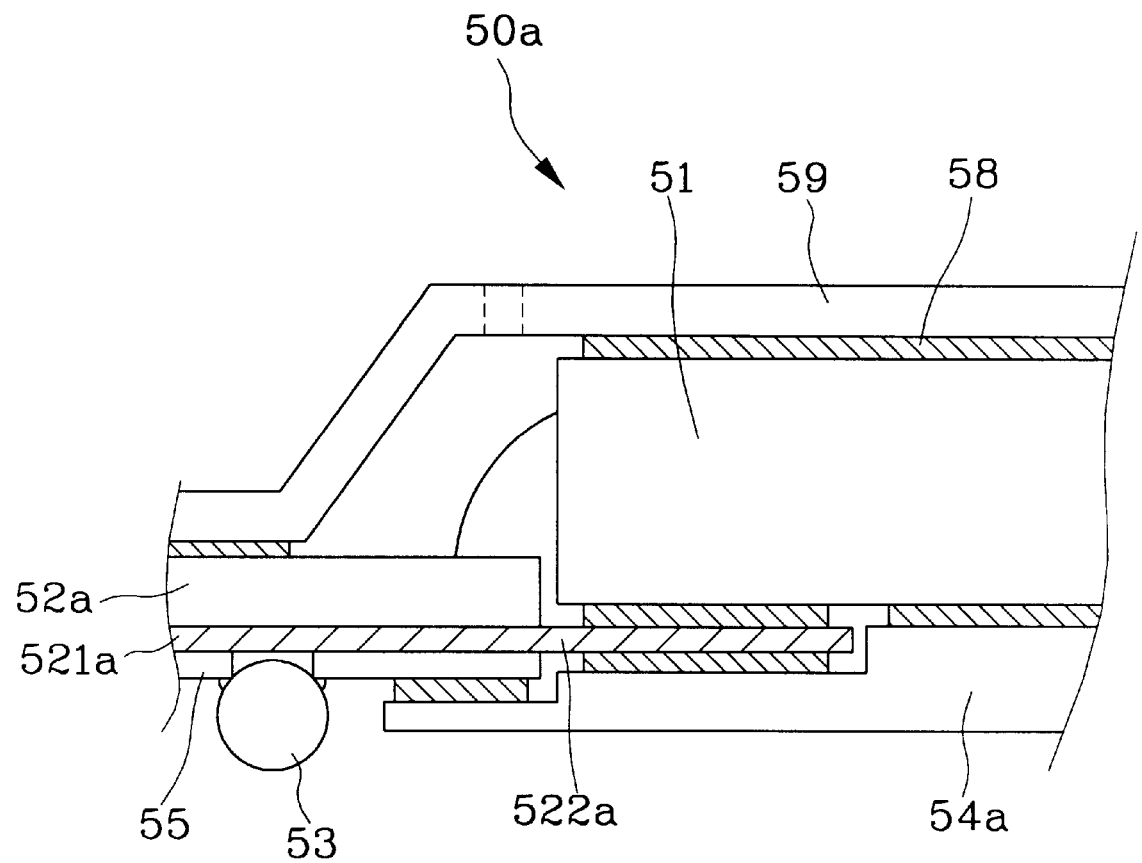
FIG. 8 is a schematic view of another embodiment of this invention.

FIG. 8 illustrates another embodiment of this invention. It is generally constructed like the one shown in FIG. 6, however the metallic circuit 521*a*, inner leads 522*a* and the solder balls 53 are located on the same side of the substrate 52*a*. The first heat dissipating member 54*a* thus may be made even thinner and may result in smaller size package.

It may thus be seen that the objects of the present invention set forth herein, as well as those made apparent from the foregoing description, are efficiently attained. While the preferred embodiments of the invention have been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A dual-sided heat dissipating structure for an integrated circuit package, comprising:

a semiconductor chip having at least one active side with a semiconductor circuitry;

a substrate having a center opening and at least one side with a metallic circuit which has a plurality of inner leads extending to the center opening;

a plurality of metallic solder balls attached to the substrate and coupling with the metallic circuit;

a first heat dissipating member having a center portion adhering to the chip on a side facing the substrate through the center opening and an outskirt portion adhered to the substrate by a non-conductive adhesive; and a second heat dissipating member adhering to a second side of the chip opposite to the active side by a non-conductive adhesive so that both the active side and the second side may dissipate heat through the first and second heat dissipating members, wherein the second heat dissipating member is a dish shape member having a concave center for holding the chip and adhering with a side of the chip remote from the substrate by a non-conductive adhesive and a flange adhering to the substrate by a non-conductive adhesive, the concave center being larger than the chip to form a closed space with the chip, the second heat dissipating member having a plurality of through apertures for air ventilation between the closed space and ambient air.

2. The dual-sided heat dissipating structure of claim 1, wherein the substrate is a Tape Automated Bonding Tape.

3. The dual-sided heat dissipating structure of claim 1, wherein the active side of the chip has a plurality of bonding pads for bonding with the inner leads.

4. The dual-sided heat dissipating structure of claim 1, wherein the first heat dissipating member has a step-shaped top surface which has a thick center portion, an intermediate portion, and a thin outskirt portion engaging respectively with the chip, inner leads and substrate.

5. The dual-sided heat dissipating structure of claim 1, wherein the non-conductive adhesive is chosen from the group consisting of epoxy, heat conducting resin and dual-sided adhesive tape.

6. The dual-sided heat dissipating structure of claim 1 further having an underfilling adhering to a perimeter of the chip and a surface of the substrate adjacent the perimeter.

\* \* \* \* \*